TRANSISTOR

Filed Oct. 5, 1954

INVENTOR.
William E. Taylor,
BY
Mueller & Aichele
Atty's.

United States Patent Office 3,087,098
Patented Apr. 23, 1963

3,087,098

TRANSISTOR

William E. Taylor, Phoenix, Ariz., assignor to Motorola, Inc., Chicago, Ill., a corporation of Illinois Filed Oct. 5, 1954, Ser. No. 460,479
7 Claims. (Cl. 317—234)

The present invention relates to semiconductor devices, and more particularly to an improved amplifying semiconductor device of the type generally referred to as a transistor.

A recent transistor is known as the alloyed-junction type. This transistor comprises a crystal wafer of semiconductor material of one conductivity type, with a pair of disc-like electrodes of a selected alloying material fused and alloyed to the opposite sides thereof. The areas of the crystal wafer adjacent the respective electrodes contain traces of the alloying material, and the alloying material is chosen so that these ares are of the opposite conductivity type to that of the crystal wafer, so that p-n junctions are formed between these areas and the base region of the crystal wafer. It is usual in present day transistors of this type for the semiconductor crystal to be composed of n-type germanium, and for indium to be used as the alloying material. However, other materials have been used to form alloyed-junction transistors of the p-n-p and n-p-n types.

In transistor units, including the alloyed-junction type described above, it has been found that the physical dimensions and properties of the semiconductor material establish an upper limit on the frequencies at which useful amplification can be obtained by the device. There has been great activity in the art in the design and construction of transistor units of all types, in the attempt to increase their frequency response.

It has been recognized that increased frequency response in the alloyed-junction transistor can be obtained (*a*) by decreasing the spacing between the emitter and collector junctions, (*b*) by reducing the base resistance, and (*c*) by reducing the area of the collector electrode to provide reduced collector capacitance. Alloyed-junction transistors have been constructed to include a relatively thick semiconductor wafer for low base resistance, and in which extremely small spacing between the emitter and collector junctions is achieved by fusing the collector junction at the bottom of a small pit drilled in one face of the semiconductor wafer. In addition, small collector area is provided by suitably controlling the amount of alloying metal used to form the collector junction. This type of high frequency alloyed junction transistor has been successfully manufactured. However, it is relatively expensive due to rather complicated design, and because of the time-consuming operations involved in providing pits in the wafers and in forming electrodes at the bottom of such pits.

A different approach for increased high frequency response has been suggested in the "grown junction" type of transistor, which was in wide-spread use prior to the advent of the more efficient "alloyed-junction" transistor. This approach consisted in the provision of a second base connection which effectively reduced the base resistance and collector capacitance for increased high frequency response of the unit. The second base connection was used to bias a portion of the emitter in the reverse direction and to confine the emitter signal to a region near the first base connection, thereby reducing the base resistance and the effective collector junction area.

The present invention provides an alloyed-junction transistor which is constructed to incorporate an additional base electrode. This aditional electrode functions in a somewhat similar manner to the additional base connection in the grown-junction transistor discussed above.

However, the present invention provides increased high frequency response in the more desirable alloyed-junction transistor.

It is, accordingly, a general object of the present invention to provide an improved alloyed-junction transistor that is constructed for relatively high frequency operation.

Yet another object of the invention is to provide such an improved high-frequency alloyed-junction transistor that may be constructed more simply and economically than the prior art high-frequency transistors of this general type.

A feature of the invention is the provision of an improved alloyed-junction transistor having its electrodes shaped and positioned so as to permit the incorporation of an additional base connection capable of controlling and confiining the current through the unit so as to reduce effectively the resistance of the base region and the effective capacity of the collector thereby to improve the high frequency response of the transistor.

The above and other features of the invention are believed to be new and are set forth with particularity in the appended claims. The invention itself, however, together with further objects and advantages thereof may best be understood by reference to the following description when taken in conjunction with the accompanying drawing in which:

FIGS. 1*a* and 1*b* are respective front and back views of a transistor unit constructed in accordance with the invention;

Figures 1A, 1B, 2, 3, 4, 5, 6, 7:
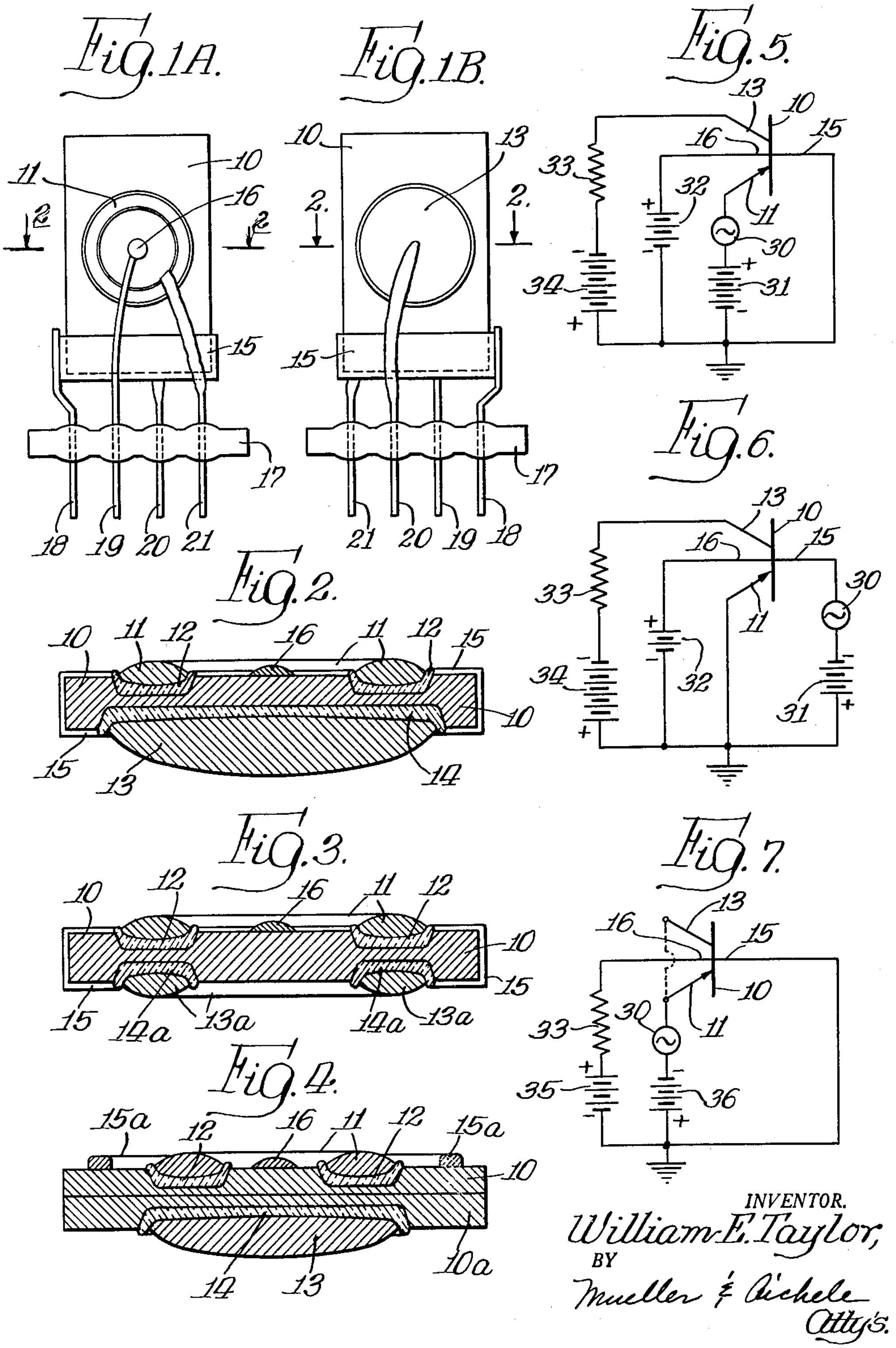
FIG. 2 is an enlarged sectional view taken along the lines 2—2 of FIGS. 1*a* and 1*b*.
FIGS. 3 and 4 are respective enlarged sectional views of modifications of the units.
FIGS. 5–7 show schematic utilization circuits for transistors constructed in accordance with the invention.

The invention provides a transistor unit which comprises a crystal wafer of semiconductor material of a selected conductivity type. An electrode of a selected alloying material is fused and alloyed to one face of the wafer to form a recrystallized area of the opposite conductivity type within the wafer adjacent the electrode. An annular electrode of a selected alloying material is fused and alloyed to the opposite face of the wafer directly opposite the other electrode to form an annular recrystallized area of the opposite conductivity type within the wafer adjacent the annular electrode and directly opposite the first-mentioned recrystallized area and spaced therefrom. A first base connection is provided in ohmic contact with the wafer, and a second base connection is positioned on the opposite face of the wafer within the annular electrode; a second base connection being spaced from the annular electrode and in ohmic contact with the wafer.

Referring now to FIGS. 1*a*, 1*b* and 2, the transistor unit shown therein includes a crystal wafer 10 of semiconductor material. The wafer may have suitable dimensions and be composed, for example, of germanium of the negative conductivity type. An emitter electrode 11 of suitable alloying material (such as indium) is fused and alloyed to one face of the crystal wafer. This electrode is in the form of a closed loop and preferably has an annular configuration. The fusing of the emitter electrode may be carried out in an inert atmosphere heat zone, with the alloying material being supported in a suitable assembly jig. During the fusion process the semiconductor material dissolves into the molten alloying material to form a saturated solution. Upon subsequent cooling, an annular recrystallized area 12 is formed in the crystal adjacent the annular electrode 11. The recrystallized area is of the opposite conductivity type to the base region of crystal 10, and a rectifying p-n emitter junction is formed between the area and the base region of the crystal.

The collector electrode 13 is formed by fusing a suitable alloying material (such as indium) to the opposite face of crystal wafer 10. The collector electrode may also be fused and alloyed to the crystal in an inert atmosphere heat zone by means of a suitable assembly jig; and a recrystallized area 14 of the opposite conductivity type to that of the base region of crystal wafer 10 is produced within the wafer adjacent the collector electrode. This latter area also forms a rectifying p-n junction with the base region of the crystal wafer 10, and this collector junction is spaced from the emitter junction by a predetermined amount.

A first base connection is made to the crystal wafer 10 by the formation of one or more ohmic soldered or plated contacts 15 around the periphery of the crystal wafer. A second base connection 16 is disposed on the face of crystal 10 within the annular emitter ring and is preferably centered therein. This second base connection, likewise, may be made by an ohmic soldered or plated connection.

The connections to the various electrodes may be made in the usual manner by terminal leads extending through an insulating slab 17, and these connections may also serve to support the crystal wafer. Lead 18 connects to the first base connection 15; lead 19 connects to the second base connection 16; lead 20 connects to the collector electrode 13; and lead 21 connects to the annular emitter 11.

The unit of FIG. 3 is similar to the one described above and like components therein have been indicated by like numerals. The only difference in the unit of FIG. 3 is that the collector electrode 13*a* and its associated recrystallized area 14*a* are also annular in shape and directly opposite the annular emitter and its corersponding annular recrystallized area.

The structure of the present invention can also be used in the intrinsic layer type of transistor. In this type, a layer of intrinsic (unalloyed) semiconductor that exhibits neither positive or negative conductivity characteristics is used between the base region and the collector junction. Such a unit is shown in FIG. 4 and it includes a semiconductor wafer 10 of, for example, the negative conductivity type with a layer 10*a* of intrinsic semiconductor disposed thereon. The annular emitter electrode 11 and its annular recrystallized area 12 are formed in the wafer 10, as before; as is the second base connection 16. The first base connection 15*a* is made annular, and this connection is disposed on the face of wafer 10 around the emitter electrode so as to contact only wafer 10 and not the intrinsic layer 10*a*. The collector 13 and its associated recrystallized area 14 are formed in the manner described previously, but in the intrinsic layer 10*a*. The purpose of the intrinsic layer 10*a*, as is well known, is to provide a high field region in which the emitter signal carriers may be aceclerated to the collector.

A grounded base circuit for the transistors of the invention (assuming a p-n-p type) is shown in FIG. 5. In this circuit, the first base 15 of the transistor is connected to ground; the emitter 11 is connected through a signal source 30 and through a positive bias source 31 to ground; the second base 16 is connected to a second positive bias source 32 whose negative terminal is connected to ground; and the collector 13 is connected through an output load resistor 33 and negative bias source 34 to ground.

The input signal (S) from source 30 is applied to the emitter electrode which is biased in the forward direction relative to the first base connection by the bias voltage ($V_e$) from source 31. The collector 13 is biased in the reverse direction relative to the first base connection by the bias voltage ($V_c$) from source 34. The output signal appears across resistor 33 for utilization. The second base connection 16 is biased relative to the first base 15 in the same sense as the emitter and this is achieved by the bias voltage ($V_{b2}$) from source 32.

When the voltage ($V_{b2}$) is made larger than the voltage ($V_e$), the portion of the emitter junction near the inside of the emitter ring and in the vicinity of the second base connection 16 is effectively biased in the reverse direction. Therefore, the emitter signal is confined to the portion of the emitter junction adjacent the outside of the emitter ring which is biased in the forward direction. This lowers the effective area of the emitter junction and effectively lowers the base resistance of the unit. However, the field between the first base connection 15 and the second base connection 16 tends to direct the flow of injected carriers through the base region away from the central regions of the collector junction, thus utilizing a smaller collector area and reducing the collector capacity. The frequency response of the unit is therefore increased by the provision of the second base connection.

The circuit of FIG. 6 shows the grounded emitter arrangement, and the latter circuit is similar to that of FIG. 5 except that the emitter 11 is grounded, and signal source 30 and bias source 31 are connected between the first base connection 15 and ground, with source 31 negative. It is clear that the transistor connected in the manner of FIG. 6 exhibits the same increased frequency response as the unit connected in the circuit of FIG. 5. The effective base resistance ($r_b$) for various second base currents ($i_{b2}$) is given by the following table:

| $i_{b2}$, milliamps | $r_b$, ohms |
|---|---|
| 0 | 650 |
| .5 | 640 |
| .7 | 600 |
| 1.0 | 570 |
| 1.5 | 460 |
| 2.0 | 270 |
| 2.5 | 200 |
| 3.0 | 150 |

A typical constructed unit had the following dimensions, and these are given herein merely by way of example are not intended to limit the invention in any way.

Crystal wafer 10—.005" x .385" x .007"
Collector diameter—.350"
Annular emitter diameter:
.250" (outside)
.204" (inside)
Emitter-collector junction spacing—.002"

Another type of known transistor is usually referred to as the "unipolar field effect" type. In this latter device, an electric current is passed through a semiconductor element between two ohmic contacts which are designated respectively as the source electrode and the drain electrode. P-n junctions are formed in the channel between the source and the drain. By suitably biasing the junctions, the channel can be gated so that the output signal may be modulated by an input signal applied to the junctions. The device of the present invention can be used as a unipolar field effect transistor by using the two base connections as the source and drain electrodes respectively. The emitter and collector can be used individually or collectively to gate the current through the channel between these two electrodes. FIG. 7 shows such a use for the device, and in this figure the first base connection 15 is connected to ground and the second base 16 is connected through load resistor 33 and positive bias source 35 to ground. A current flows between the base connections with a resulting voltage drop across resistor 33. The emitter 11 or collector 13, or both, are biased negatively by bias source 36 to control the conductivity of the channel, and the signal from source 30 modulates the conductance of the semiconductor and, hence, controls the amplitude of the output signal appearing across resistor 33.

The invention provides, therefore, an improved high-frequency transistor of the alloyed-junction type that is constructed so that its effective base resistance and collector capacity can be materially reduced by simple electrical, rather than complicated mechanical means.

While particular embodiments of the invention have been shown and described modifications may be made and it is intended in the appended claims to cover all such modifications as fall within the true spirit and scope of the invention.

I claim:

1. In a semconductor device having a semiconductor crystal wafer of a selected conductivity type with opposite faces the plural electrode structure on said wafer including in combination, a collector electrode of a selected alloying material alloyed to one face of said wafer in a rectifying connection, an annular emitter electrode of a selected alloying material alloyed to the opposite face of said wafer in a rectifying connection and having an annular-inner-edge portion, said two named electrodes being positioned opposite to one another so that a line at right angles through said annular-inner-edge portion and said wafer extends through said collector electrode at an internal portion, said plural electrode structure further comprising a first base electrode in ohmic connection with said opposite face of said wafer and within said annular-inner-edge portion of said emitter electrode, and a second base electrode in ohmic connection with said wafer and in a position outwardly of said annular emitter electrode.

2. In a semiconductor device having a semiconductor wafer with opposite faces, an assembly with said wafer consisting in combination of a ring emitter contact in rectifying connection with one face and having an annular inner edge and an annular outer edge, a collector contact in rectifying connection with the opposite face of the water, said contacts being positioned so that the inner annular edge of the ring emitter contact is directly opposite from a portion of the collector contact, and with only two additional contacts for said wafer, one of which is in ohmic connection with the wafer centrally of said ring emitter contact and the other is in ohmic connection with the wafer and spaced outwardly from said ring emitter contact.

3. In a semiconductor device, the combination consisting of a semiconductor crystal wafer having only four contact portions thereon, and including oppositely disposed faces, with one of said contact portions being centrally disposed on one face of said wafer and in ohmic connection therewith, a second contact portion on the opposite face of said wafer in rectifying connection therewith, a third contact portion having a ring-shaped configuration and being in rectifying connection with said one face and spaced outwardly on said face from said one contact portion, and with the fourth contact portion in said wafer being in ohmic connection therewith and disposed outwardly on said wafer from said third contact portion, said ring-shaped third contact portion having an inner-annular-edge portion and an outer-annular-edge portion and being positioned on said wafer relative to said second contact portion so that a line at right angles to the wafer faces passes through said inner-annular-edge portion and wafer and into said second contact portion and said outer-annular-edge portion is substantially coextensive with the outer edge portion of said second contact portion.

4. In a semiconductor crystal member assembly for a transistor device, the combination including a semiconductor crystal member having oppositely disposed faces and no more than four contact portions on said member, said contact portions consisting of a collector portion in a rectifying connection on one face of said crystal member, a ring emitter portion in a rectifying connection on the opposite face of said crystal member and having an annular-outer-edge portion and an annular-inner-edge portion thereof, with said annular inner edge portion positioned on said member directly opposite from a part of said collector contact portion so that a line at right angles to the faces of said crystal member will pass through said annular-inner-edge portion and into said collector contact portion part to thereby maximize the current handling capabilities of a transistor device when the semiconductor crystal member assembly is incorporated therein, and with said two other of the four contact portions in said assembly being in ohmic connection with said semiconductor crystal member.

5. In a semiconductor device, the combination including a semiconductor crystal wafer having opposite faces and a contact structure therewith comprising an annular contact in rectifying connection with said wafer at one face thereof and having an inner-annular-edge portion, an enlarged contact in rectifying connection with said wafer at the opposite face thereof and positioned thereon so that said inner-annular-edge portion of said annular contact is directly opposite the central part of said enlarged contact, said contact structure comprising further a pair of contacts each of which is in ohmic connection with said wafer, one of said pair being positioned on the wafer face inwardly of said annular contact and the other of said pair being positioned on said wafer outwardly of said annular contact, and means mounting and electrically connecting said wafer and contact structure assembly into said semiconductor device.

6. In a semiconductor device including in combination, a semiconductor crystal wafer having opposite faces and a contact structure therewith comprising a first annular contact in rectifying connection with said wafer at one face thereof and having an inner-annular-edge portion, a second annular contact in rectifying connection with said wafer at the opposite face thereof having an inner-annular-edge portion and being positioned on said wafer face so that the inner-annular-edge portion of each of said annular contacts are substantially directly opposite one another and said annular contacts themselves are substantially coextensive with one another, said contact structure comprising further a pair of contacts each of which is in ohmic connection with said wafer, one of said pair being positioned on said wafer outwardly of said first annular contact and the other of said pair being positioned inwardly of said first annular contact, and means mounting and electrically connecting said wafer and contact structure assembly into said semiconductor device.

7. In a semiconductor device including in combination, a semiconductor crystal wafer having opposite faces and a contact structure therewith comprising an anular emitter contact in rectifying connection with said wafer at one face thereof and having an inner-annular-edge portion, a collector contact in rectifying connection with said wafer at the opposite face thereof and positioned thereon so that said inner-annular-edge portion is directly opposite the central part of said collector contact, said contact structure comprising further a pair of contacts each of which is in ohmic connection with said one face of said wafer, with one of said pair of contacts being ring-shaped and positioned outwardly of said annular emitter contact, and with the other of said pair being button-shaped and positioned inwardly of said annular emitter contact, and means mounting and electrically connecting said wafer and contact structure assembly into said semiconductor device.

References Cited in the file of this patent

UNITED STATES PATENTS

| | | |
|---|---|---|
| 2,524,033 | Bardeen | Oct. 3, 1950 |
| 2,644,852 | Dunlap | July 7, 1953 |
| 2,672,528 | Shockley | Mar. 16, 1954 |
| 2,754,431 | Johnson | July 10, 1956 |
| 2,801,348 | Pankove | July 30, 1957 |
| 2,802,159 | Stump | Aug. 6, 1957 |
| 2,999,195 | Saby | Sept. 5, 1961 |

FOREIGN PATENTS

| | | |
|---|---|---|
| 520,677 | Belgium | June 30, 1953 |
| 1,080,034 | France | May 26, 1954 |